United States Patent
Kim et al.

(10) Patent No.: US 7,563,104 B2
(45) Date of Patent: Jul. 21, 2009

(54) PRINTED CIRCUIT BOARD HAVING CONNECTORS

(75) Inventors: Han Kim, Gyunggi-do (KR); Yang Je Lee, Chungcheongbuk-do (KR); Sang Jin Oh, Gyunggi-do (KR); Mi Ja Han, Jeollabuk-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 11/896,298

(22) Filed: Aug. 30, 2007

(65) Prior Publication Data

US 2008/0057756 A1 Mar. 6, 2008

(30) Foreign Application Priority Data

Aug. 31, 2006 (KR) .................. 10-2006-0083583

(51) Int. Cl.
*H01R 12/00* (2006.01)
(52) U.S. Cl. .......................... 439/66; 439/84
(58) Field of Classification Search .............. 439/66, 439/84
See application file for complete search history.

(56) References Cited

U.S. PATENT DOCUMENTS

| | | | | |
|---|---|---|---|---|
| 2,825,037 A | * | 2/1958 | French | 439/65 |
| 2,922,978 A | * | 1/1960 | Engel | 439/82 |
| 2,969,517 A | * | 1/1961 | Gluck | 439/82 |
| 3,040,291 A | * | 6/1962 | Schweitzer et al. | 439/637 |
| 3,106,436 A | * | 10/1963 | Weiss | 439/741 |
| 3,230,297 A | * | 1/1966 | Means | 174/262 |
| 3,317,652 A | * | 5/1967 | Johannessen et al. | 174/261 |
| 3,391,455 A | * | 7/1968 | Hyogo et al. | 29/852 |
| 3,530,422 A | * | 9/1970 | Goodman | 439/62 |
| 3,864,004 A | * | 2/1975 | Friend | 439/844 |
| 3,899,231 A | * | 8/1975 | Bray | 439/80 |
| 3,902,153 A | * | 8/1975 | Narozny | 439/844 |
| 4,017,143 A | * | 4/1977 | Knowles | 439/873 |
| 4,083,623 A | * | 4/1978 | Lynch | 439/741 |
| 4,275,944 A | * | 6/1981 | Sochor | 439/267 |
| 4,418,475 A | * | 12/1983 | Ammon et al. | 29/842 |
| 4,523,796 A | * | 6/1985 | Rank | 439/65 |
| 4,575,167 A | * | 3/1986 | Minter | 439/83 |
| 5,152,696 A | * | 10/1992 | Krajewski et al. | 439/75 |
| 5,281,770 A | * | 1/1994 | Kamei et al. | 174/261 |
| 5,562,462 A | * | 10/1996 | Matsuba et al. | 439/70 |
| 6,783,397 B2 | * | 8/2004 | Yang Lee | 439/607 |
| 7,014,487 B2 | * | 3/2006 | Ishikawa | 439/267 |
| 7,070,419 B2 | * | 7/2006 | Brown et al. | 439/66 |
| 7,114,961 B2 | * | 10/2006 | Williams | 439/66 |

* cited by examiner

*Primary Examiner*—James Harvey

(57) ABSTRACT

The Printed Circuit Board (PCB) has connectors which each include a terminal part and a connector pin. The terminal part is formed in one end of the PCB and is provided with a terminal hole. The connector pin is configured such that one end thereof is inserted into the terminal hole, and the remaining end thereof extends to protrude outside the terminal hole and is also bent several times, thus forming a contact part that is elastically deformed, and electrically connected to a pad part provided in a target PCB for connection. Thus, a desirable signal transmission characteristic is guaranteed, so that the reliability of electronic devices using the PCB can be improved and the manufacturing cost can also be reduced.

4 Claims, 4 Drawing Sheets

PRINTED CIRCUIT BOARD HAVING CONNECTORS

CROSS REFERENCE TO RELATED APPLICATION

This application claims the benefit of Korean Patent Application No. 10-2006-0083583, filed on Aug. 31, 2006, entitled "Connector of PCB," which is hereby incorporated by reference in its entirety into this application.

BACKGROUND OF THE INVENTION

1. Field of the Invention

The present invention relates generally to a printed circuit board having an integral connection structure that is used for electrical connection with another board, and, more particularly, to a printed circuit board having integral connectors that can maintain stable connection with another printed circuit board, for which electrical connection is necessary, without requiring the use of separate connectors, and can also realize a reduction in thickness.

2. Description of the Related Art

Generally, a Printed Circuit Board (PCB) functions to conveniently connect various elements for an electronic product using a predetermined pattern, and is widely used for all electronic products ranging from electronic home appliances, including a digital TeleVision (TV), to high-tech communication devices. Such a PCB is classified as a general-purpose PCB, a PCB for a module and a PCB for a package according to the purpose of use.

That is, a PCB is formed in such a way as to construct necessary circuits by attaching a thin layer, made of copper, to one surface of a phenol-resin insulation board, an epoxy-resin insulation board or the like and performing etching on a wiring pattern for circuits, and bore holes for mounting elements, and is classified as a single-sided PCB, a double-sided PCB, or a multilayer PCB according to the number of wiring circuit surfaces. A PCB having a large number of layers is applied to high-precision products because the ability to mount components is excellent. Recently, with the development of the electronics industry, an ultra-thin PCB having a thickness of 0.04 mm~0.2 mm has been widely used.

A single-sided PCB is used for relatively simple electronic devices. However, recently, the use of a double-sided PCB, in which circuits are formed on both surfaces thereof and are connected to each other via through-holes, or a multilayer PCB, which is realized by expanding the double-sided PCB to a plurality of layers instead of just two surfaces, has increased.

A method of manufacturing a PCB, which is generally known, is briefly described below. An original clad board, which is formed by applying a copper foil having a thickness on the μm scale on an insulation board, is used. A pre-treatment step, a through-hole processing step, an electroless plating step, a circuit printing step, an etching step, and a post-treatment step are performed on the original clad board.

Here, the pre-treatment step is a step of cutting the clad board and preparing a full-scale PCB manufacturing process. Through-holes are formed in the original clad board, which is cut to an appropriate size at the pre-treatment step, using a drill, and then thin copper foils are formed on the respective surfaces of the through-holes formed at the pre-treatment step using electroless plating. This makes electro copper plating possible later.

Subsequently, at the circuit printing step, a photoresist film is applied on the original clad board, portions of the original clad board other than copper circuit portions and through-hole portions in a previously designed wiring diagram are masked by exposing and developing them, and then a protection layer for protecting the copper foils of the circuit portions is formed by performing solder plating or nickel and gold plating on the resulting structure. Thereafter, at the etching step, the photoresist film mask is removed, and only circuit wiring is allowed to remain by etching copper portions other than the circuit portions. In the case where a solder plating layer is formed, the solder plating layer is removed. Thereafter, at the post-treatment step, the process of manufacturing a PCB board is completed through intermediate inspection, routing, and final inspection.

Meanwhile, with the recent trend toward small-sized and lightweight electronic products, various types of connectors are used to dispose two or more circuit boards at different locations and electrically connect the circuit boards.

As an example, a Rigid Printed Circuit Board (RPCB), on which a main circuit and electronic components are mounted, and a Flexible Printed Circuit Board (FPCB), on which modular electronic components are mounted and which has a desirable bending characteristic, are individually manufactured, and then a connector is used to electrically connect the RPCB and the FPCB to each other.

FIG. 1 is a diagram showing the structure of a prior art connector for electrically connecting an RPCB and an FPCB.

As shown in FIG. 1, the connector 200 for electrically connecting circuit boards, for which electrical connection is necessary, is illustrated. The connector 200 is disposed between a main circuit board 100, which is used to mount a main circuit and principal components thereon and is provided as a typical RPCB, and the rigid part 155 of an auxiliary circuit board 150, which is used to mount auxiliary circuits and modular electronic components thereon and is provided as an FPCB, and is configured to connect the main circuit board 100 and the rigid part 155 to each other.

The connector 200 includes a housing 210, which is made of synthetic resin, such as plastic, and is formed using injection molding, and is configured such that a predetermined space is formed in the housing 210, and elastic workpieces 230 are accommodated in the housing 210 so that both ends of the workpieces 230 protrude elastically in the both direction of both side the housing 210.

That is, the connector 200 electrically connects the main circuit board 100 and the auxiliary circuit board 150 in such a way that one end of each elastic workpiece 230 is jointed to the pad part 110 of the main circuit board 100 using solder, and the other end of each elastic workpiece 230 comes into elastic contact with the rigid part 155 of the auxiliary circuit board 150.

Meanwhile, the main circuit board 100 and the sub circuit board 150 are mechanically coupled to each other using a screw fastening structure in the state in which the connector 200 is disposed therebetween.

However, the prior art connector 200, described above, is provided with the plurality of elastic workpieces 230 in the housing 210, and thus the structure thereof is complicated. Furthermore, one end of each elastic workpiece 230 must be fastened to the main circuit board 100 using soldering, and thus the operation efficiency is low. As a result, there are disadvantages in that an electrical signal transmission characteristic is degraded and a high manufacturing cost is required.

In particular, the connector basically makes a structure thick. As a result, there are limitations to the reduction of the size of electronic products that employ the connector.

SUMMARY OF THE INVENTION

Accordingly, the present invention has been made keeping in mind the above problems occurring in the prior art, and the present invention is intended to provide a circuit board having integral connectors that guarantees stable and improved electrical connection using a simple structure in which connector pins are inserted into respective connectors of a circuit board, and to realize a reduction in thickness, with the result that the freedom of product design can be increased.

The present invention provides a PCB having connectors, each of the connectors comprising a terminal part formed in one side of the PCB and provided with a terminal hole; and a connector pin configured such that one end thereof is inserted into the terminal hole, and the remaining end thereof extends to protrude outside the terminal hole and is also bent several times, thus forming a contact part that is elastically deformed, and electrically connected to a pad part provided in a target PCB for connection.

Furthermore, the connector pin is formed in such a way that one end of the connector pin extends and is also bent several times so as to be elastically inserted into the terminal hole.

Furthermore, the contact part of the connector pin is bent such that the upper surface thereof is gently curved.

Furthermore, the terminal part is formed in an RPCB.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The characteristics and advantages of the present invention will become more apparent from the following detailed description in conjunction with the accompanying drawings. Prior to the detailed description of the present invention, the terms or words used in the specification and claims of the present invention should not necessarily be understood by their general meanings or dictionary definitions, but should be understood to have meanings and represent concepts conforming to the technical spirit of the present invention on the basis of the principle by which inventors can define the concept of terms properly to explain their invention in the best way.

A PCB having connectors according to the present invention is described in detail with reference to the accompanying drawings below.

Figure 1:
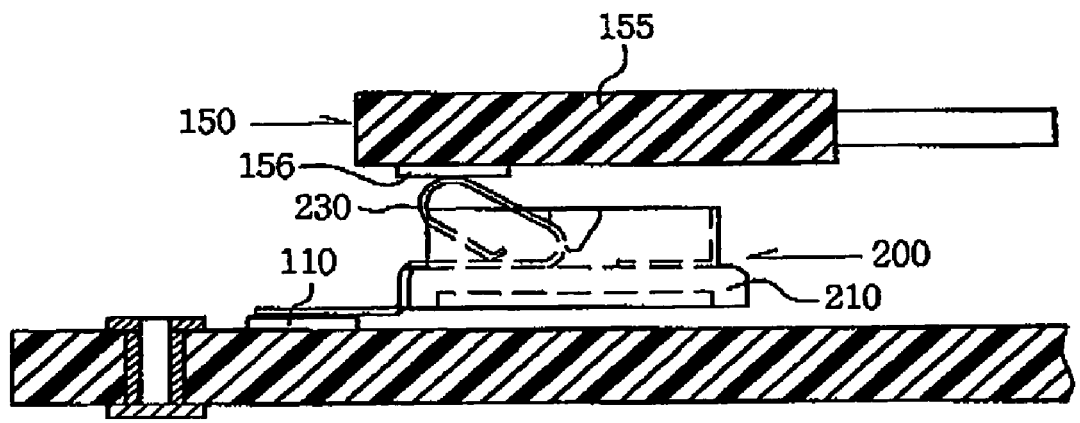
FIG. 1 is a view showing a prior art connector for a PCB.
Figure 2:
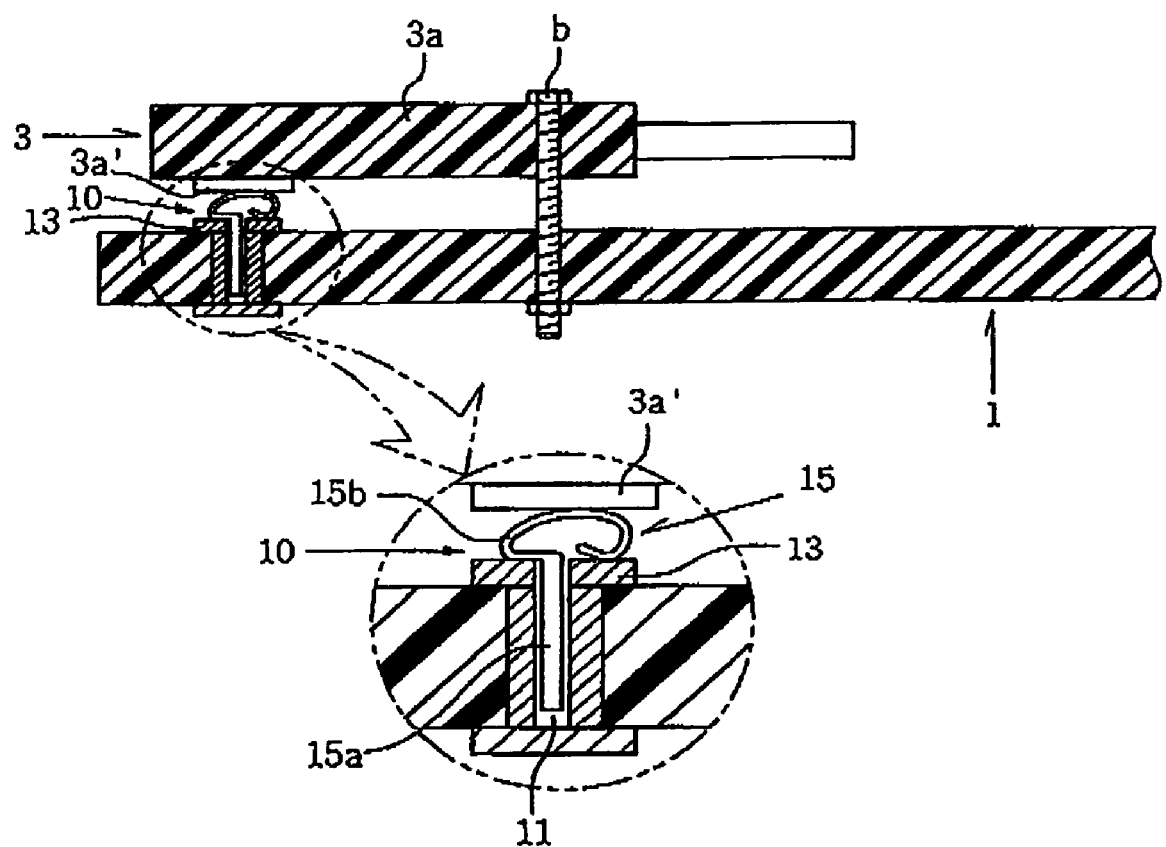
FIG. 2 is a view showing an embodiment of a PCB having connectors, according to the prevent invention.
Figure 3:
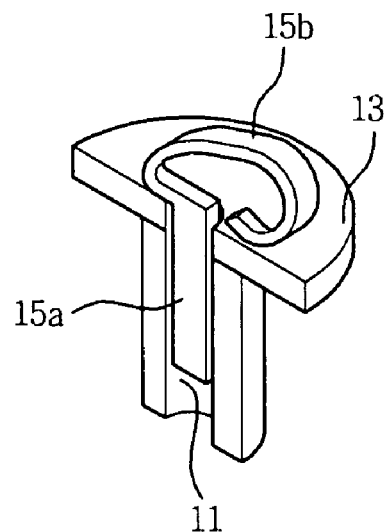
FIG. 3 is a perspective view of a principal part illustrating a connector pin of FIG. 2.
Figure 4:
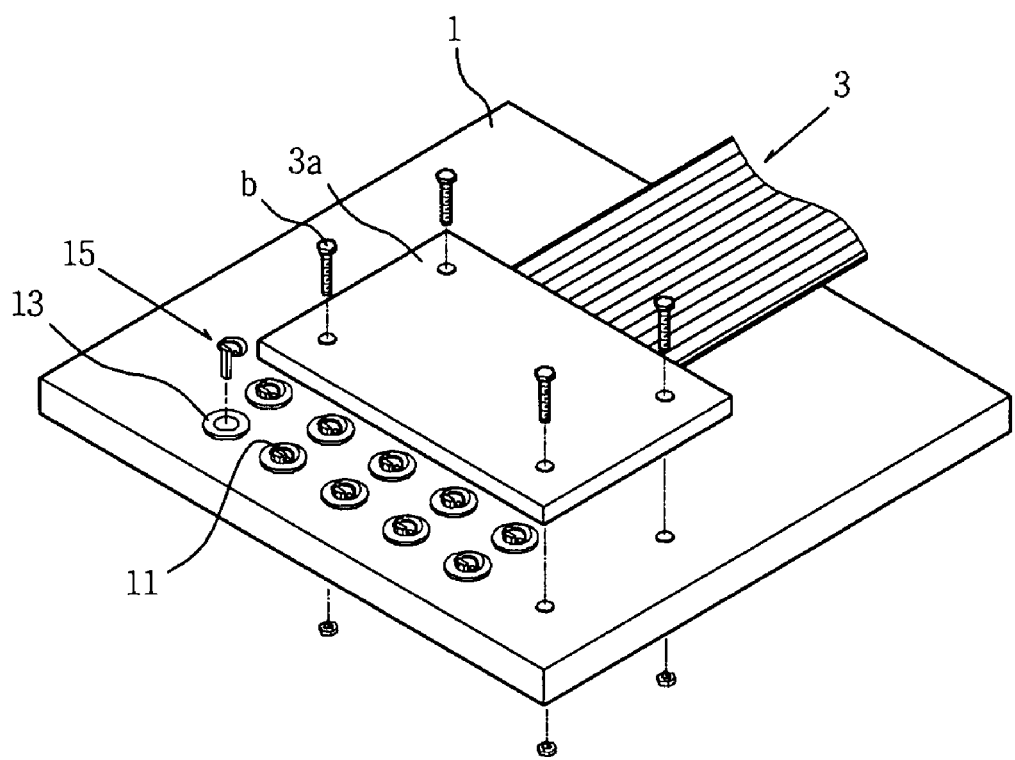
FIG. 4 is a perspective view illustrating an example of application of the PCB having connectors, shown in FIG. 2.

FIG. 2 is a view showing an embodiment of a PCB having connectors according to the prevent invention, FIG. 3 is a perspective view of a principal part illustrating the connector pin of FIG. 2, and FIG. 4 is a perspective view illustrating an example of application of the PCB having connectors, shown in FIG. 2.

As shown in the drawings, the principal technical feature of the present invention is to provide connectors 10, which allow two PCBs to be connected to each other in a simple structure without requiring the use of any existing connector at the time of connecting the PCBs for which electrical connection is necessary, thus not only guaranteeing a desirable signal transmission characteristic but also realizing a reduction in thickness.

Meanwhile, the connectors 10 of the present invention may be used to connect various forms and types of circuit boards. For convenience, in the present invention, a description is made based on an embodiment in which the connectors 10 are applied to an RPCB 1, and an FPCB 3 is electrically connected to the connectors 10.

Each of the connectors 10 of the present invention includes a terminal part 13 and a terminal hole 11, which are integrated with an RPCB 1, and a connector pin 15, which electrically comes into contact with the terminal part 13 through the insertion of one end of the connector pin 15 into the terminal hole 11.

First, the RPCB 1 having the connectors 10 of the present invention is manufactured using a typical board manufacturing method, which is well known. In this case, an original clad board, which is configured such that a copper foil having a thickness on the µm scale is applied on an insulating board, is used. Furthermore, the RPCB 1 is manufactured by performing a pre-treatment step, a through-hole processing step, an electroless plating step, a circuit printing step, an etching step and a post-treatment step on the original clad board. Since the method of manufacturing an RPCB 1 and the construction of the RPCB 1 may be implemented using well-known technology, a description thereof is omitted.

Meanwhile, as shown in the drawings, the RPCB 1 manufactured through the above-described steps is integrated with each terminal part 13, in which a terminal hole 11 having a predetermined size is formed, in one side of the RPCB 1.

That is, the terminal part 13 is a kind of pad part for connection with an external circuit, and is configured such that circuits formed on the RPCB 1 are electrically connected with electronic components.

The terminal part 13, having the above-described construction, is formed such that the terminal hole 11 having a small radius passes through the center portion thereof, or is formed to have a predetermined depth. In this case, the terminal hole 11 is formed in a size of several µm diameter, and one end of the connector pin 15 is inserted into the terminal hole 11.

The connector pin 15 is formed such that the one end thereof is inserted into the terminal hole 11 formed in the RPCB 1, and the other end of the connector pin 15 extends to protrude outside the terminal hole 11 and is also bent several times, thus forming a contact part 15b.

In this case, it is preferred that the contact part 15b be formed such that the upper surface thereof is bent to be gently curved, and the bottom thereof is formed flat to contact the terminal part 13 over a wide area, as shown in the drawings.

Meanwhile, it is preferred that the one end of the connector pin 15, that is, an insertion part 15a extending integrally from the contact part 15b, be vertically formed, and have a diameter such that it can be slid and inserted into the terminal hole 11.

When the contact part 15b, constructed as described above, has a diameter smaller than the terminal hole 11, movement attributable to an assembly gap can be expected. However, since the terminal hole 11 has a diameter of µm, the actual amount that the contact part 15b of the connector pin 15 moves in the terminal hole 11 is very little. In the case where the moved amount of the contact part 15b affects the reliability, the coupling may be achieved using adhesive agent.

The process and operation of assembling the circuit board having connectors, according to the first embodiment of the present invention, constructed as described above, are described below.

First, the terminal hole 11 and the terminal part 13, which are used for connection with external circuits, are formed in the RPCB 1. In this case, the terminal hole 11 and the terminal part 13 are implemented using well-known technology used in a typical board manufacturing process, and thus a detailed description thereof is omitted.

Subsequently, the insertion part 15a of the connector pin 15 is completely inserted into the terminal hole 11. In this case, the bottom of the contact part 15b of the connector pin 15 comes into contact with the terminal part 13, and thus the electrical connection with the circuits of the RPCB 1 is made. In this state, a target circuit board, that is, the FPCB 3 in the present invention, for which electrical connection is necessary, is located over the RPCB 1, that is, the contact part 15b of the connector pin 15.

In this case, the location of a pad part 3a' formed on the rigid part 3a of the FPCB 3 is adjusted such that the pad part 3a' overlaps the respective contact parts 15b of the connector pins 15. After the location adjustment has been completed, the RPCB 1 and the FPCB 3 are coupled to each other through the insertion of screw members b into a plurality of assembly holes, which are formed in the RPCB 1, and a plurality of assembly holes, which are formed in the FPCB 3 to correspond to respective holes in the RPCB 1, and thus the assembly is completed.

When the RPCB 1 and the FPCB 3 are coupled to each other using the screw members b, the contact parts 15b of the respective connector pins 15, which are disposed between the RPCB 1 and the FPCB 3, are elastically deformed, and thus the state in which the terminal parts 13 of the RPCB 1 come into close contact with the pad part 3a' of the FPCB 3 is stably maintained.

Accordingly, the RPCB 1 and the FPCB 3 are electrically connected by a simple structure, so that a desirable electrical signal transmission characteristic, attributable to the simplification of the structure, can be guaranteed.

Furthermore, the gap between the RPCB 1 and the FPCB 3 merely corresponds to the protruding height of the contact part 15b of the connector pin 15, so that minimized thickness can be achieved, in contrast to the case where existing connectors are used, with the result that the freedom of design can be increased to reduce the size of electronic products using the PCB of the present invention.

Figure 5:
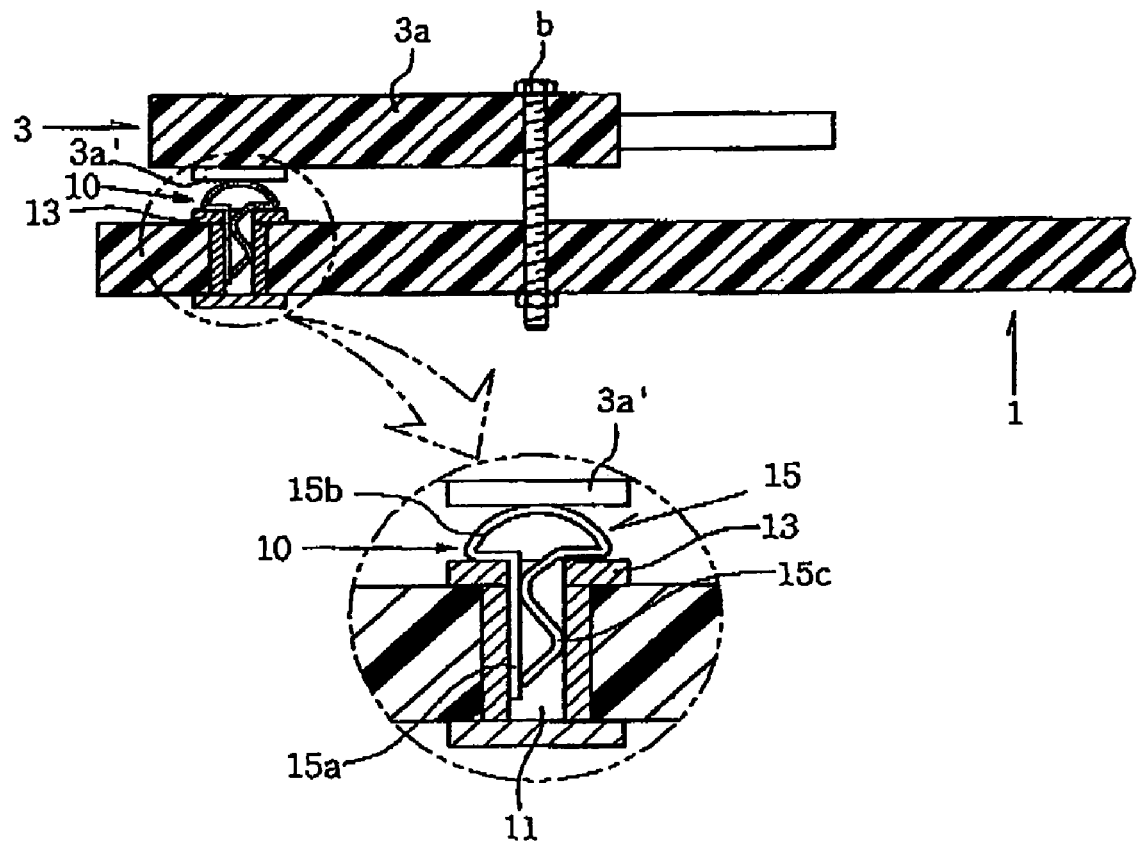
FIG. 5 is a view showing another embodiment of a PCB board having connectors, according to the present invention.
Figure 6:
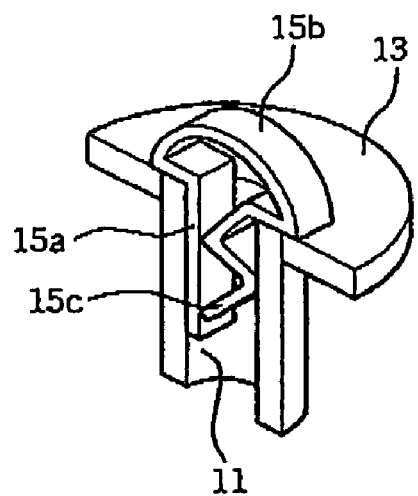
FIG. 6 is a perspective view of a principal part illustrating a connector pin of FIG. 5.
Figure 7:
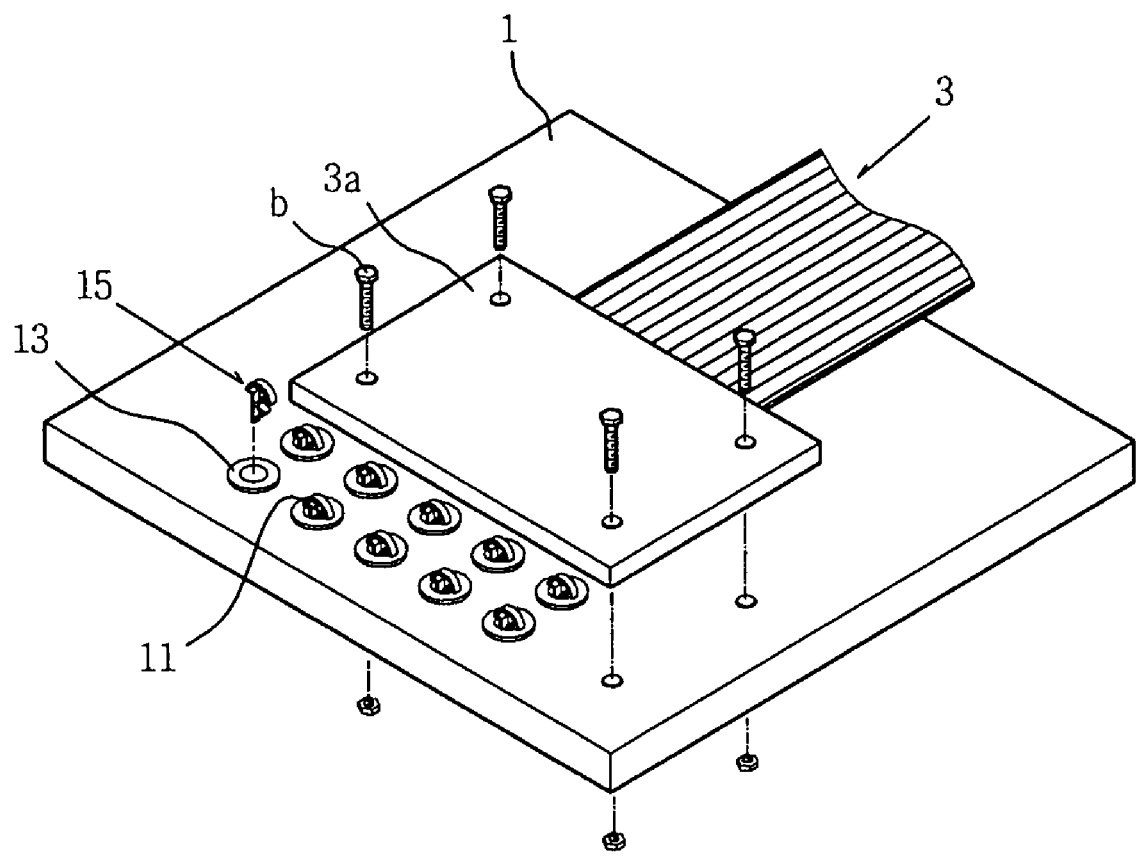
FIG. 7 is a perspective view illustrating an example of application of the PCB having connectors, shown in FIG. 5.

FIG. 5 is a view showing another embodiment of a PCB board having connectors, according to the present invention, FIG. 6 is a perspective view of a principal part illustrating a connector pin of FIG. 5, and FIG. 7 is a perspective view illustrating an example of application of the PCB having connectors, shown in FIG. 5.

As showing in the drawings, the construction of the connectors 10 of the present embodiment is the same as that of the connectors proposed in the above-described embodiment, and thus the same reference characters are used to designate the same parts or members in the following description.

As shown in the drawings, each of the connectors 10 of the present embodiment includes a terminal part 13 and a terminal hole 11, which are integrated with an RPCB 1, and a connector pin 15, one end of which is inserted into the terminal hole 11 and one surface of which electrically comes into close contact with the terminal part 13.

Here, since the construction of the terminal parts 13 and the terminal holes 11, which are formed in the RPCB 1, is the same as that of the terminal parts and terminal holes of the above-described embodiment, a detailed description thereof is omitted. It should be noted that the present embodiment is characterized in that the connector pin 15 constituting each connector 10 is elastically inserted into a corresponding terminal hole 11 in the RPCB 1.

The construction of each connector pin 15 is described in detail below. The connector pin 15 includes an insertion part 15a, which is formed by bending a metal member having a predetermined length several times, and extends vertically to be inserted into the terminal hole 11 formed in the RPCB 1, a contact part 15b, which extends from the insertion part 15a to protrude outside the terminal hole 11 and is also bent several times, thus resulting in elastic deformation in the vertical direction thereof, and an elastic insertion part 15c, which extends from the contact part 15b in the direction of the terminal hole 11 and is also bent several times, thus elastically expanding in the terminal hole 11 together with the insertion part 15a.

That is, the connector pin 15 has the shape of a clip, and includes the insertion part 15a and the elastic insertion part 15c, so that elastic insertion into the terminal hole 11 of the RPCB 1 can be maintained, with the result that the connector pin 15 can be prevented from easily moving in the terminal hole 11 and from being separated from the terminal hole 11.

When the connector pin 15, constructed as described above, is inserted into the terminal 11 of the RPCB 1 using the insertion part 15a and the elastic insertion part 15c, the bottom of the contact part 15b comes into close contact with the terminal part 13 of the RPCB 1, and thus electrical connection of the contact part 15b of the connector pin 15 is made.

In this state, a pad part 3a' formed on the rigid part 3a of an FPCB 3 is located on the contact parts 15b of the respective connector pins 15 to achieve contact, and then the RPCB 1 and the FPCB 3 are fastened to each other using a plurality of screw members b. In this case, the contact part 15b of the connector pin 15, which is disposed between the RPCB 1 and the FPCB 3, is elastically deformed, so that the terminal part 13 of the RPCB 1 comes into close contact with the pad part 3a' of the FPCB 3, by which a stable connection is maintained.

As described above, in accordance with the PCB having connectors according to the present invention, PCBs can be electrically connected to each other using a simple structure in which terminal holes are formed in a PCB and connector pins are inserted into respective terminal holes, so that a desirable signal transmission characteristic is guaranteed, with the result that the reliability of electronic devices using the PCB of the present invention can be improved and the manufacturing cost can also be reduced.

In particular, the gap between PCBs merely corresponds to the height of the contact part of each connector pin, so that a great reduction in thickness can be achieved, in contrast to the prior art, with the result that the present invention can be useful in industry because the freedom of design for electronic devices using the PCB of the present invention can be further increased.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A Printed Circuit Board (PCB) comprising:

a plurality of connectors, wherein each of the connectors comprises a terminal part formed in one side of the PCB and provided with a terminal hole, and a connector pin comprising an insertion part formed vertically so as to be inserted into the terminal hole, and a contact part protruding and extending from the insertion part, the contact part being bent several times so as to be deformed elastically, the contact part having a bottom surface formed levelly so as to be contacted with an upper surface of the terminal part and a top surface electrically connected to a pad part provided in a target PCB for connection; and a plurality of assembly holes and screw members to connect the PCB to a target PCB.

2. The PCB as set forth in claim 1, wherein the connector pin further comprises an elastic insertion part extending from the contact part toward the terminal hole, the elastic insertion part being bent several times so as to be elastically expandable in the inside of the terminal hole.

3. The PCB as set forth in claim 1, wherein the contact part of the connector pin is bent such that an upper surface thereof is gently curved.

4. The PCB as set forth in claim 1, wherein the terminal part is formed in a Rigid Printed Circuit Board (RPCB).

* * * * *